United States Patent
Chowdhury et al.

(10) Patent No.: US 7,164,311 B2
(45) Date of Patent: Jan. 16, 2007

(54) METHOD AND APPARATUS FOR TUNING GMC FILTER

(75) Inventors: Golam R. Chowdhury, Austin, TX (US); Douglas R. Holberg, Wimberly, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 10/954,887

(22) Filed: Sep. 30, 2004

(65) Prior Publication Data

US 2006/0066392 A1    Mar. 30, 2006

(51) Int. Cl.
*H03K 5/00* (2006.01)
(52) U.S. Cl. .................... 327/553; 327/552
(58) Field of Classification Search ......... 327/552–559
See application file for complete search history.

(56) References Cited

U.S. PATENT DOCUMENTS

| | | | | |
|---|---|---|---|---|
| 5,625,317 A | * | 4/1997 | Deveirman | 327/553 |
| 5,994,951 A | * | 11/1999 | Mazhar et al. | 327/553 |
| 6,163,207 A | * | 12/2000 | Kattner et al. | 327/553 |
| 6,194,958 B1 | * | 2/2001 | Goldfarb et al. | 327/552 |
| 6,208,215 B1 | * | 3/2001 | Sauer | 331/108 C |
| 6,366,161 B1 | * | 4/2002 | Koazechi | 327/553 |
| 6,388,510 B1 | * | 5/2002 | Hayashi et al. | 327/552 |
| 6,404,277 B1 | * | 6/2002 | Lee et al. | 327/553 |
| 6,646,498 B1 | * | 11/2003 | Mohieldin et al. | 327/553 |
| 6,704,560 B1 | * | 3/2004 | Balteanu et al. | 455/333 |
| 6,816,006 B1 | * | 11/2004 | Ravatin et al. | 327/553 |
| 6,917,252 B1 | * | 7/2005 | Wyszynski | 333/17.1 |

* cited by examiner

*Primary Examiner*—Dinh T. Le
(74) *Attorney, Agent, or Firm*—Howison & Arnott, L.L.P.

(57) ABSTRACT

A system and method for providing a tunable GMC filter is disclosed wherein a transconducted element having an attenuator in a feedback loop therewith is allowed to oscillate at a first oscillation frequency. An input to the filter enables tuning of the oscillation frequency to a pre-determined frequency.

19 Claims, 11 Drawing Sheets

METHOD AND APPARATUS FOR TUNING GMC FILTER

TECHNICAL FIELD OF THE INVENTION

The present invention relates to GMC filters, and more particularly, to a system and method for tuning GMC filters.

BACKGROUND OF THE INVENTION

A GMC filter consists of a $G_m$ element connected to a capacitor C. It is a low pass filter having a roll off frequency that is tuned responsive to inputs to the $G_m$ element. The capacitance C may vary from process to process. The value of $G_m$ is dependent upon the process and the temperature with the device containing the GMC filter. Most existing transconductance filters are tuned using a voltage or current value provided from the output of the GMC filter which is applied to the transconductance element $G_m$ of the filter.

SUMMARY OF THE INVENTION

The present invention overcomes the foregoing and other problems with a system and method for providing a tunable GMC filter. A transconductance element, having an attenuator and a comparator connected in a negative feedback loop between the input and output of the transconductance element forms an oscillation circuit that oscillates at an oscillation frequency. A determination is made of the oscillation frequency, and a tuning current is selected to provide a predetermined frequency. The tuning current is applied to the GMC filter to tune the GMC filter to the predetermined frequency.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
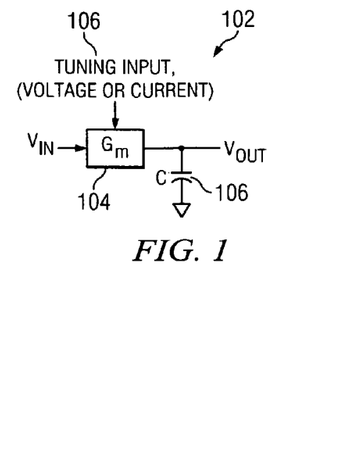
FIG. 1 illustrates a GMC filter.
Figure 2:
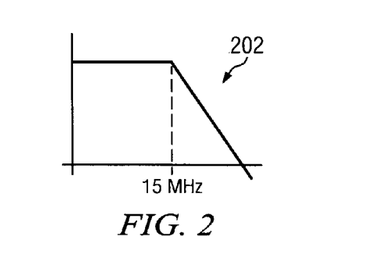
FIG. 2 illustrates a transfer function of a GMC filter.

Referring now to the drawings, and more particularly to FIG. 1, there is illustrated a GMC filter 102. The GMC filter 102 consists of a transconductance element 104 connected to a capacitor 106. An input voltage $V_{in}$ applied to the GMC filter 102 is filtered to provide an output voltage $V_{out}$. FIG. 2 illustrates the transfer function 202 associated with the GMC filter 102 illustrated in FIG. 1. The transfer function 202 illustrates that the GMC filter 102 is a low pass filter having a first roll off frequency at 15 MHz by way of example. The roll off frequency of 15 MHz may be tuned by providing a tuning input to the transconductance element 104. The tuning input 106 may be either a voltage or current input.

Figure 3:
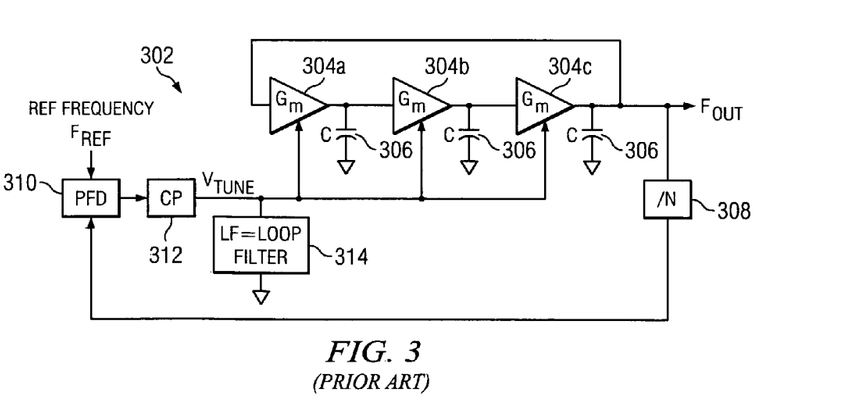
FIG. 3 illustrates a prior art voltage tuned GMC filter used as a VCO in a PLL.

Referring now to FIG. 3, there is illustrated a first prior art embodiment of a GMC filter used as a voltage controlled oscillator 302 within a phase lock loop. The voltage controlled oscillator 302 consists of a number of transconductance elements 304 wherein the output of a last transconductance element 304c is connected to the input of a first transconductance element 304a. Connected to the output of each transconductance element 304 is a capacitor having a first end connected to the output of transconductance element 304 and a second end connected to ground. The output of the final transconductance element 304c provides a frequency output $F_{OUT}$. The output of the final transconductance element 304c is also connected to the input of a frequency divide by N circuit 308. The output of the divide by N circuit is provided to a first input of a phase frequency detector (PFD) 310. The second input of the phase frequency detector circuit 310 is connected to receive a reference frequency $F_{REF}$. The phase frequency detector 310 determines the difference between the reference frequency $F_{REF}$ and the output frequency $F_{OUT}$ and provides an input to a charge pump 312. The output of the charge pump 312 provides a voltage signal that tunes the transconductance elements 304 to the desired reference frequency. Additionally, connected to the output line of the charge pump 312 is a loop filter 314 connected between the output of charge pump 312 and ground.

Figure 4:
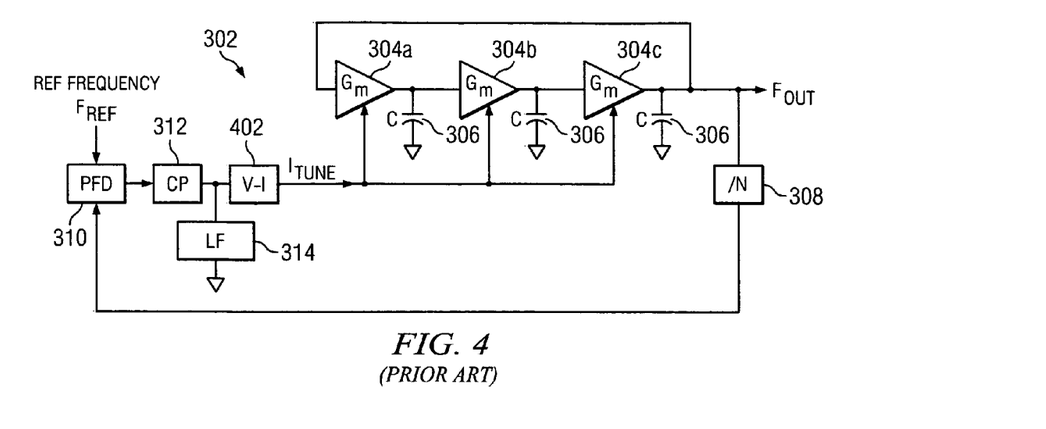
FIG. 4 illustrates a prior art current tuned GMC filter used as a VCO in a PLL.

Referring now to FIG. 4, there is illustrated a first prior art embodiment of a GMC filter used as a current controlled oscillator 302 within a phase lock loop. The current controlled oscillator 302 consists of a number of transconductance elements 304 wherein the output of a last transconductance element 304c is connected to the input of a first transconductance element 304a. Connected to the output of each transconductance element 304 is a capacitor having a first end connected to the output of transconductance element 304 and a second end connected to ground. The output of the final transconductance element 304c provides a frequency output $F_{OUT}$. The output of the final transconductance element 304c is also connected to the input of a frequency divide by N circuit 308. The output of the divide by N circuit is provided to a first input of a phase frequency detector (PFD) 310. The second input of the phase frequency detector circuit 310 is connected to receive a reference frequency at $F_{REF}$. The phase frequency detector 310 determines the difference between the reference frequency $F_{REF}$ and the output frequency $F_{OUT}$ and provides an input to a charge pump 312. The output of the charge pump 312 is connected to the input of a voltage to current converter 402. The output of the voltage to current converter 402 provides a tuning current $I_{TUNE}$ that is used to tune the transconductance elements 304 to the desired reference frequency. Additionally, connected to the output line of the charge pump 312 is a loop filter 314 connected between the output of charge pump 312 and ground.

Figure 5:
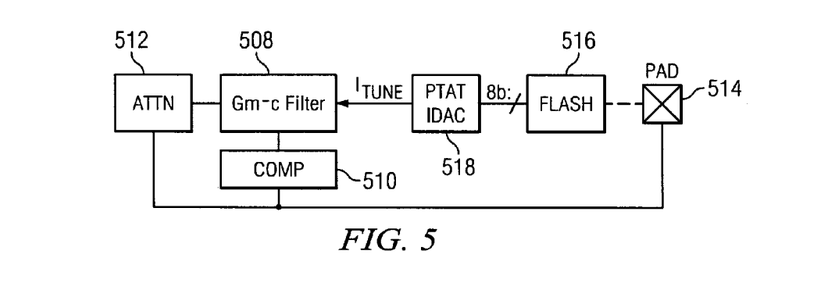
FIG. 5 is a block diagram illustrating the system for tuning a GMC filter according to the present disclosure.

Referring now to FIG. 5, there is illustrated a general block diagram of the system for tuning a GMC filter 508 operating as a current controlled oscillator. The GMC filter 508 has output connected to its input in a negative feedback mode. Under ideal conditions this would enable the GMC filter 508 to oscillate by itself at a 15 MHz frequency. However, the amplitude provided by the GMC filter 508 is not sufficient to cause and sustain the oscillation at 15 MHz. To sustain the oscillation, the GMC filter 508 has its output connected to a comparator circuit 510.

Comparator circuit 510 transforms the oscillation frequency from the GMC filter 508 to oscillate between the power and ground rails. Thus, a clock-like waveform is produced between power (3.0V) and ground (0V). This 0–3V waveform is outside of the limited linear input range of the GMC filter 508. The attenuator 512 is connected between an output of the comparator 510 and the input of the GMC filter 508. The attenuator 512 attenuates the rail-to-rail output of the comparator 510 to force the input into the GMC filter 508 to be within the linear operating range of the GMC filter 508. The comparator output 514 is also connected to a PAD 514. The frequency of the signal provided to the PAD 514 is used by a FLASH memory 516 to select a tuning value that is provided to an IDAC 518. The FLASH memory 518 includes a table associating measured frequencies with tuning values to achieve a desired frequency. Responsive to the input tuning value and a bias current (IPTAT), the IDAC 518 generates a current proportional to the absolute temperature that tunes the GMC filter 508 to a desired oscillation frequency.

Figure 6:
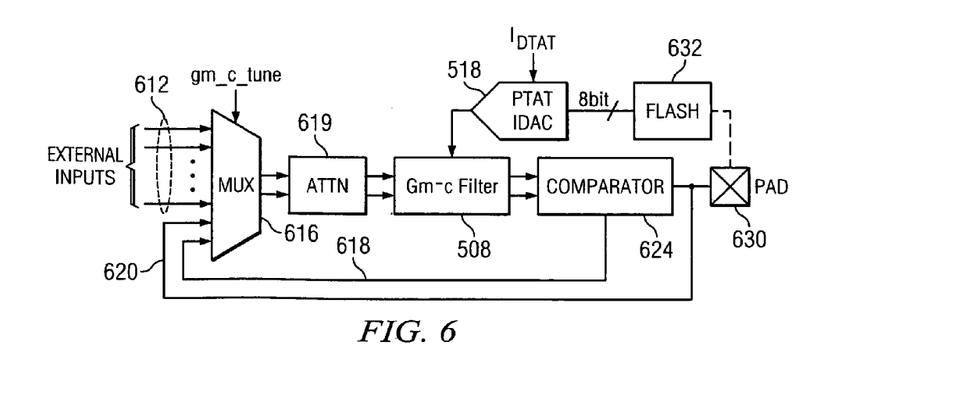
FIG. 6 is a block diagram more fully describing the tunable GMC filter of the present disclosure.

Referring now to FIG. 6, there is provided an illustration of a particular embodiment of the system and method for tuning the GMC filter 508 of the present disclosure. A multiplexor 616 includes a pair of input lines 618 and 620 from comparator 624 and also some external input lines 612 from external data circuits. The inputs of the multiplexer 616 connected to lines 612, 618 and 620 are enabled and disabled via a control input 622 responsive to the "gm_c_tune" signal applied to the multiplexor 616. When the circuitry is in a data transmission mode, the inputs connected to lines 612 are enabled to multiplex these signals to the attenuator 619 over lines 621. During data transmission mode, the internal inputs 618 and 620 are disabled. When the GMC filter 508 is in a tuning mode, the inputs connected to lines 618 and 620 are enabled while the data inputs connected to lines 612 are disabled. In tuning mode the GMC filter 508 oscillates at a frequency and may be tuned to operate at a desired frequency. The attenuator 619 attenuates the signals provided on lines 618 and 620 to be within the linear input range of GMC filter 508. The GMC filter 508 operates as previously discussed and has low pass filter characteristics having a roll off frequency which may be tuned responsive to an input current from the IDAC 518. In the preferred embodiment the roll off frequency is 15 MHz. The input of the GMC filter 508 is connected to its output in a negative feedback mode. Thus, the positive output of the GMC filter 508 is connected to its negative input and the negative output is connected to the positive input.

Comparator 624 is connected to the GMC filter 508 via lines 626 and 628. The comparator 624 drives the oscillation of the signal from the GMC filter 508 between the power and ground rails. The output of the comparator 624 is provided to the input of multiplexer 616 via lines 618 and 620 and to a pad 630. The signal provided to pad 630 is provided outside of the chip to determine its frequency.

If the signal is not on the desired frequency, values in flash memory 632 may be used to tune the frequency to a desired level. The flash memory 632 contains a table having 8-bit tuning variable for the IDAC 518. Each tuning variable is associated with a particular tuning frequency that tunes the GMC filter 508 to a desired oscillation frequency. The tuning variable is an 8-bit input provided to the IDAC 518 over line 634. The IDAC 518 generates a tuning current responsive to the provided 8-bit value from the flash memory 632 and the IPTAT current which is provided to the IDAC 518 from a band gap generator that is proportional to absolute temperature. The IDAC 518 provides the IDAC tuning current to the GMC filter 508 and tunes the filter to a desired frequency of oscillation during its tuning mode. When the GMC filter 518 reaches the desired frequency, this is reflected as the desired frequency output, from the comparator 624.

Figure 7:
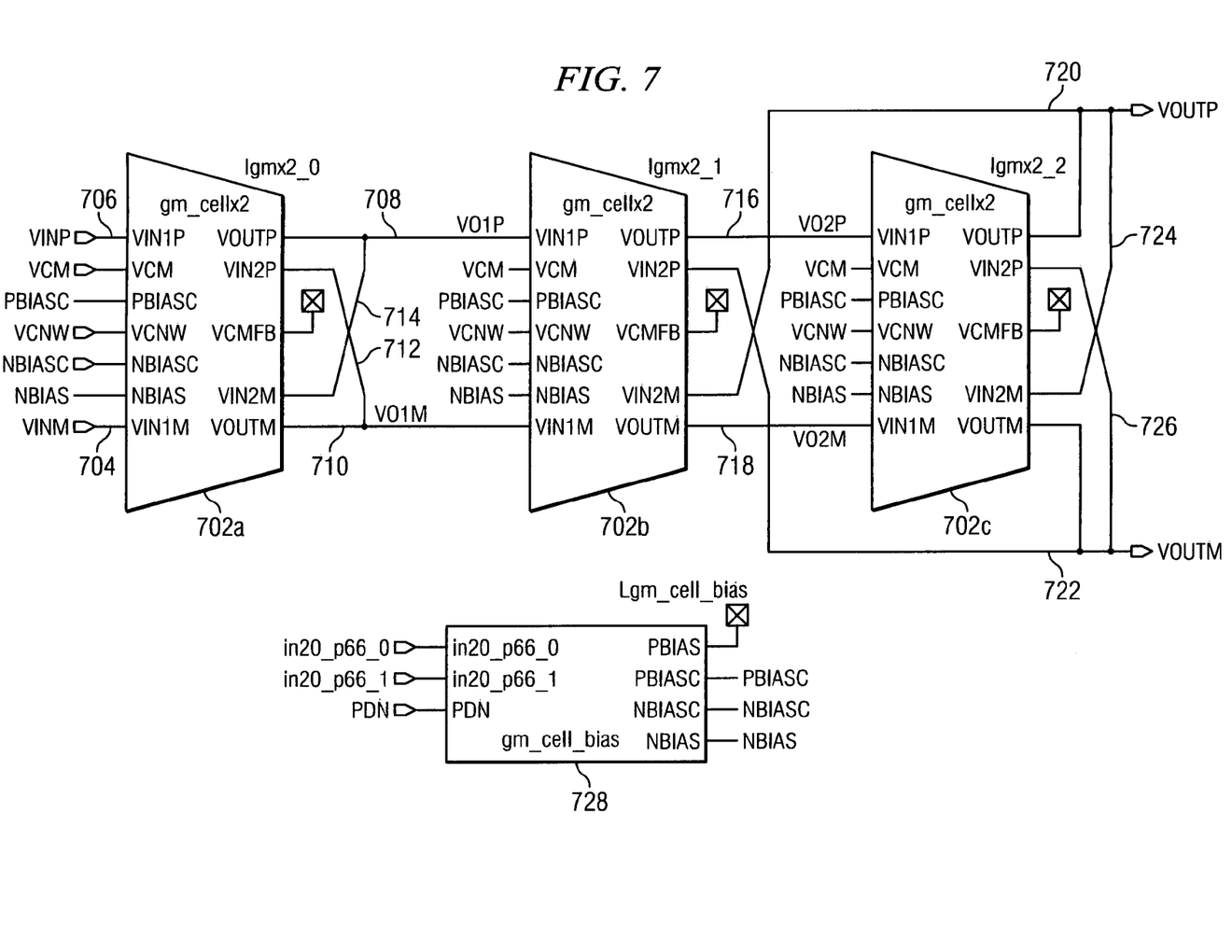
FIG. 7 is a block diagram of the GMC filter.

Referring now to FIG. 7, there is illustrated a block diagram of the GMC filter 508 of FIG. 6. The GMC filter consists of several GMC filter elements 702. The GMC filter element 702a is connected to receive an input signal on lines 704 and 706. GMC filter element 702a and GMC filter element 702b are interconnected via lines 708 and 710 and are cross coupled by lines 712 and 714. GMC filter element 702b is connected to GMC filter element 702c via lines 716 and 718. GMC filter element 702b is also connected to the outputs of GMC filter element 702c via lines 720 and 722. Input lines 724 and 726 are also connected to the lines 720 and 722 respectively. A bias circuit 728 provides bias inputs to each of the GMC filter elements 702.

Figure 8:
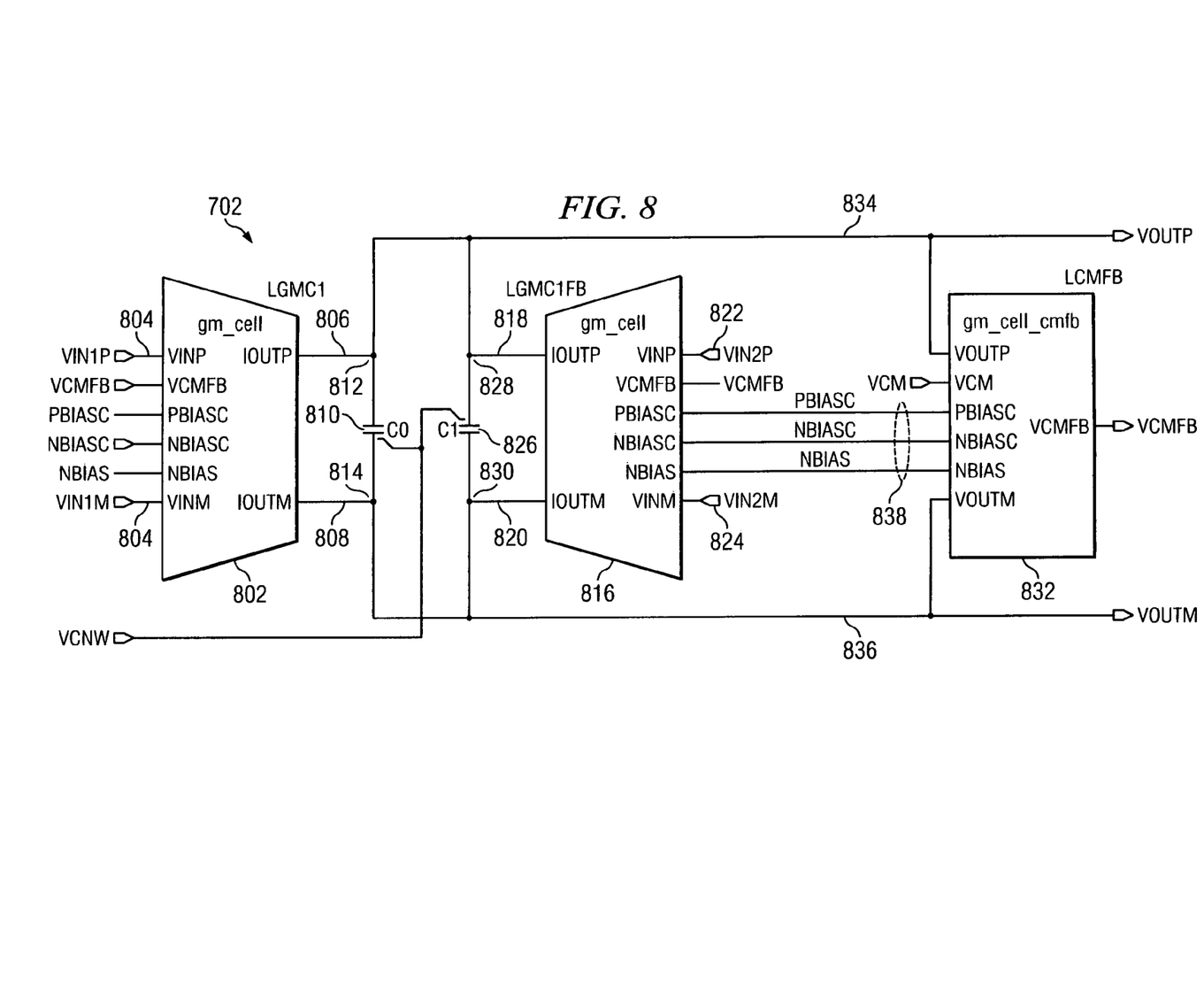
FIG. 8 is a block diagram of the GMC filter elements of the GMC filter.

Referring now to FIG. 8, there is illustrated the configuration of each of the GMC filter element 702. Block 802 responsive to input voltages on input lines 804 provides output currents on lines 806 and 808. Connected between lines 806 and 808 is a capacitor 810 at nodes 812 and 814 respectively. Block 816 also provides an output on lines 818 and 820 responsive to an input signal on lines 822 and 824. A capacitor 826 is connected between lines 818 and 820 at nodes 828 and 830 respectively. Block 832 is connected to nodes 812 and 828 via line 834 and to nodes 814 and 830 via line 836. Block 832 is the common mode feedback circuit and provides common-mode voltage to the outputs $V_{OUTP}$, $V_{OUTN}$ and is connected to block 816 via a number of bias lines 838.

Figure 9:
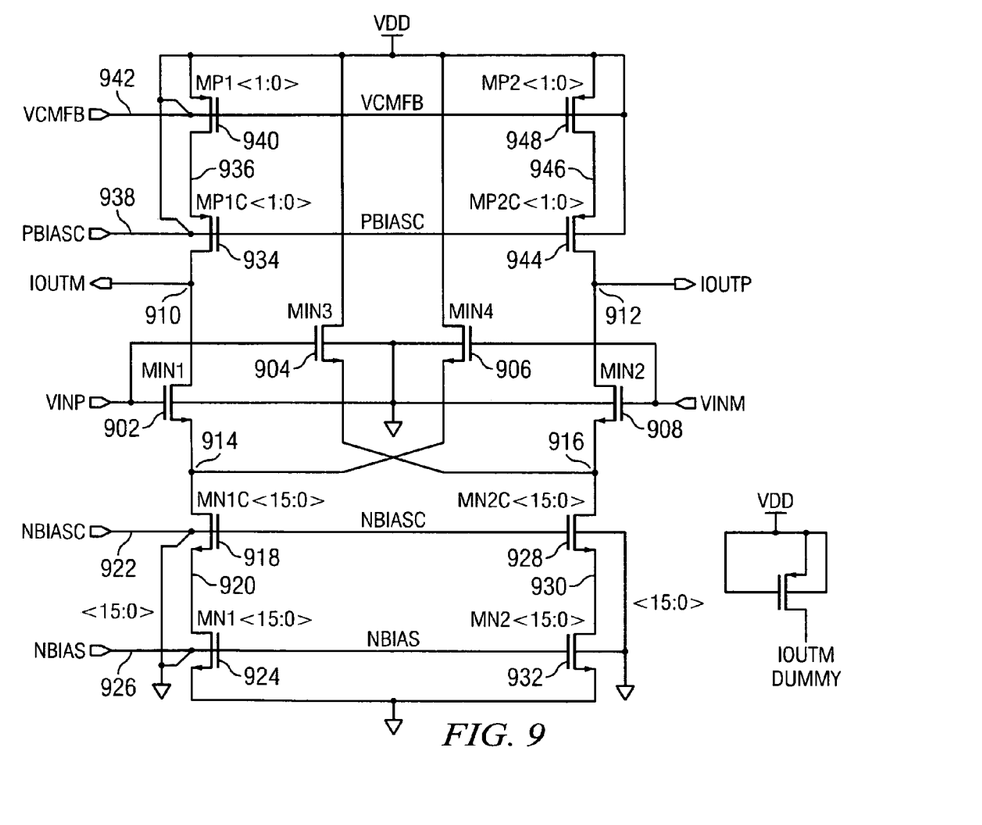
FIG. 9 is a schematic diagram of the Gm cell blocks of the GMC filter.

Referring now to FIG. 9, there is illustrated a schematic diagram of the GM cell blocks 802 and 816 of FIG. 8. The inputs are connected to the gates of transistors 902, 904, 906 and 908. The drains of transistors 902 and 908 are connected to output nodes 910 and 912. The source of transistor 902 is connected to the source of transistor 906 at node 914. The source of transistor 908 is connected to the source of transistor 904 at node 916. Transistor 918 has its drain source path connected between node 914 and node 920. The gate of transistor 918 is connected to a bias input 922. Transistor 924 has its drain source path connected between node 920 and ground. The gate of transistor 924 is connected to another bias input 926. The drain source path of transistor 928 is connected between node 916 and node 930. The gate of transistor 928 is connected to bias input 922. Transistor 932 has its drain source path connected between node 930 and ground. The gate of transistor 932 is connected to bias input 926.

Transistor 904 has its drain source path connected between Vdd and node 916. Transistor 906 has its drain source path connected between Vdd and node 914. Transistor 934 has its source drain path connected between node 936 and node 910. The gate of transistor 934 is connected to bias input 938. The source drain path of transistor 940 is connected between Vdd and node 936. The gate of transistor 940 is connected to vcmfb input 942. Transistor 944 has its source drain path connected between node 946 and node 912. The gate of transistor 944 is connected to bias input 938. Transistor 948 has its source drain path connected between Vdd and node 946. The gate of transistor 948 is connected to vcmfb input 942.

Figure 10:
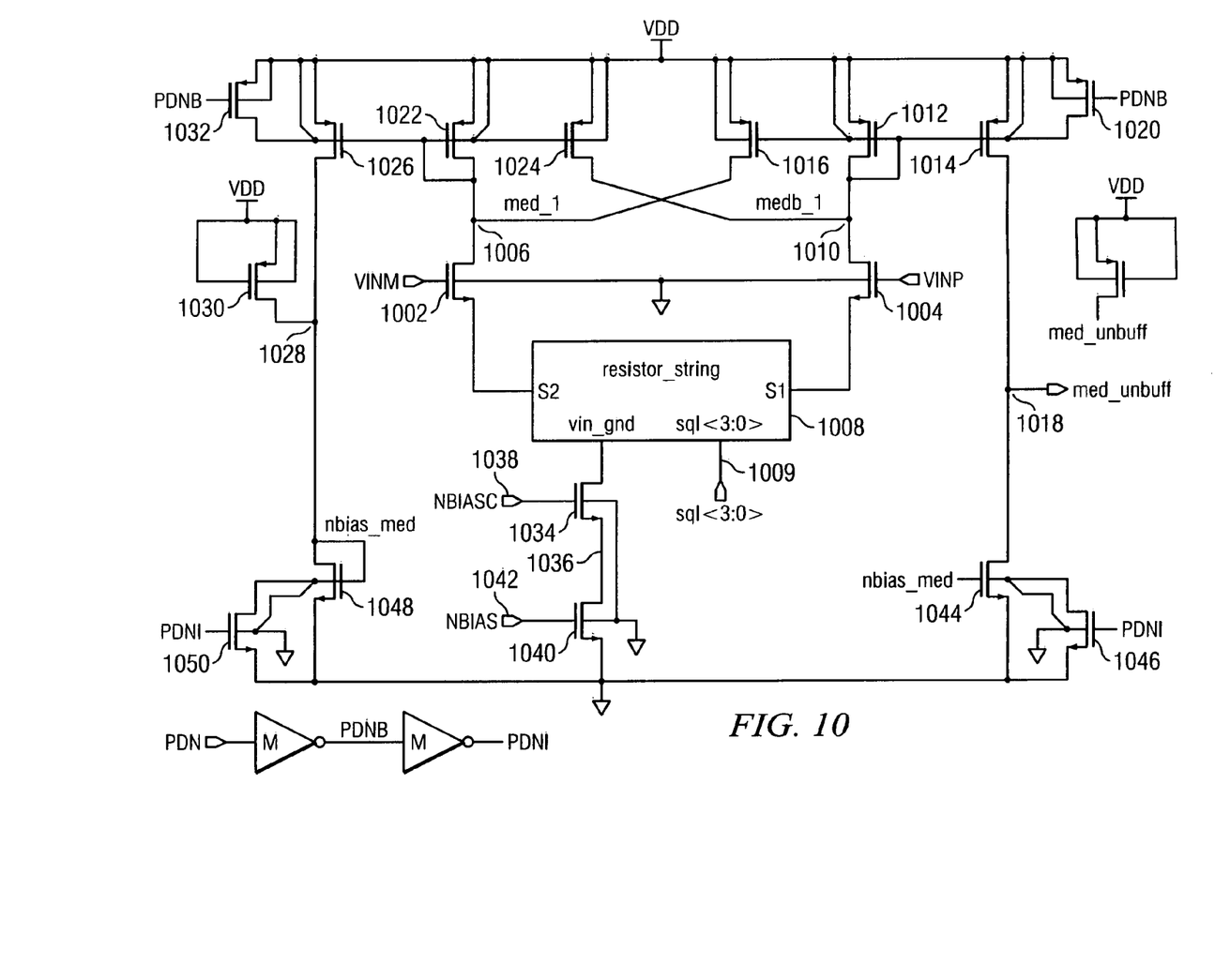
FIG. 10 is a schematic diagram of the comparator circuit of the GMC filter.
Figure 11A:
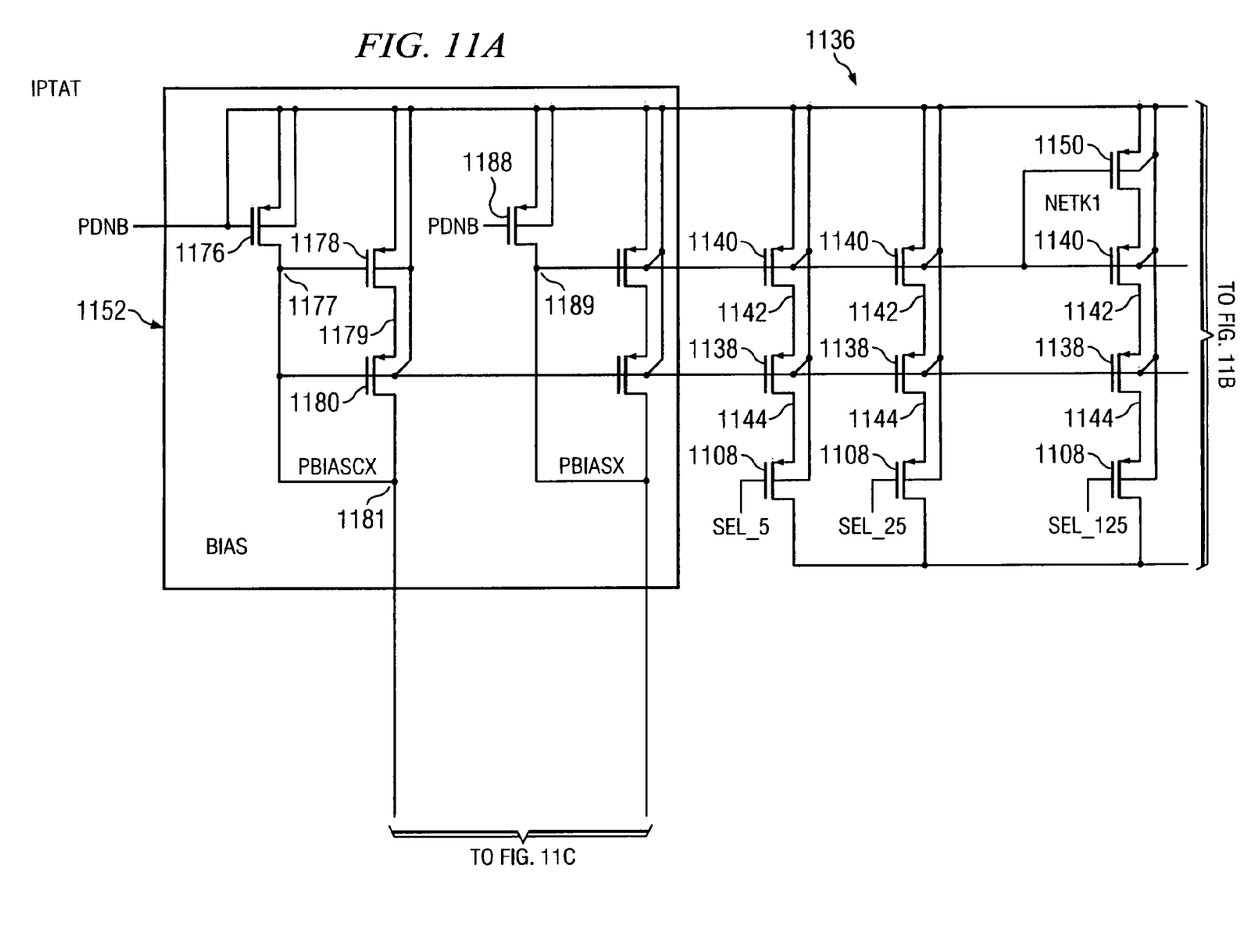
FIG. 11 is a schematic diagram of the IDAC of the GMC filter.
Figure 11B:
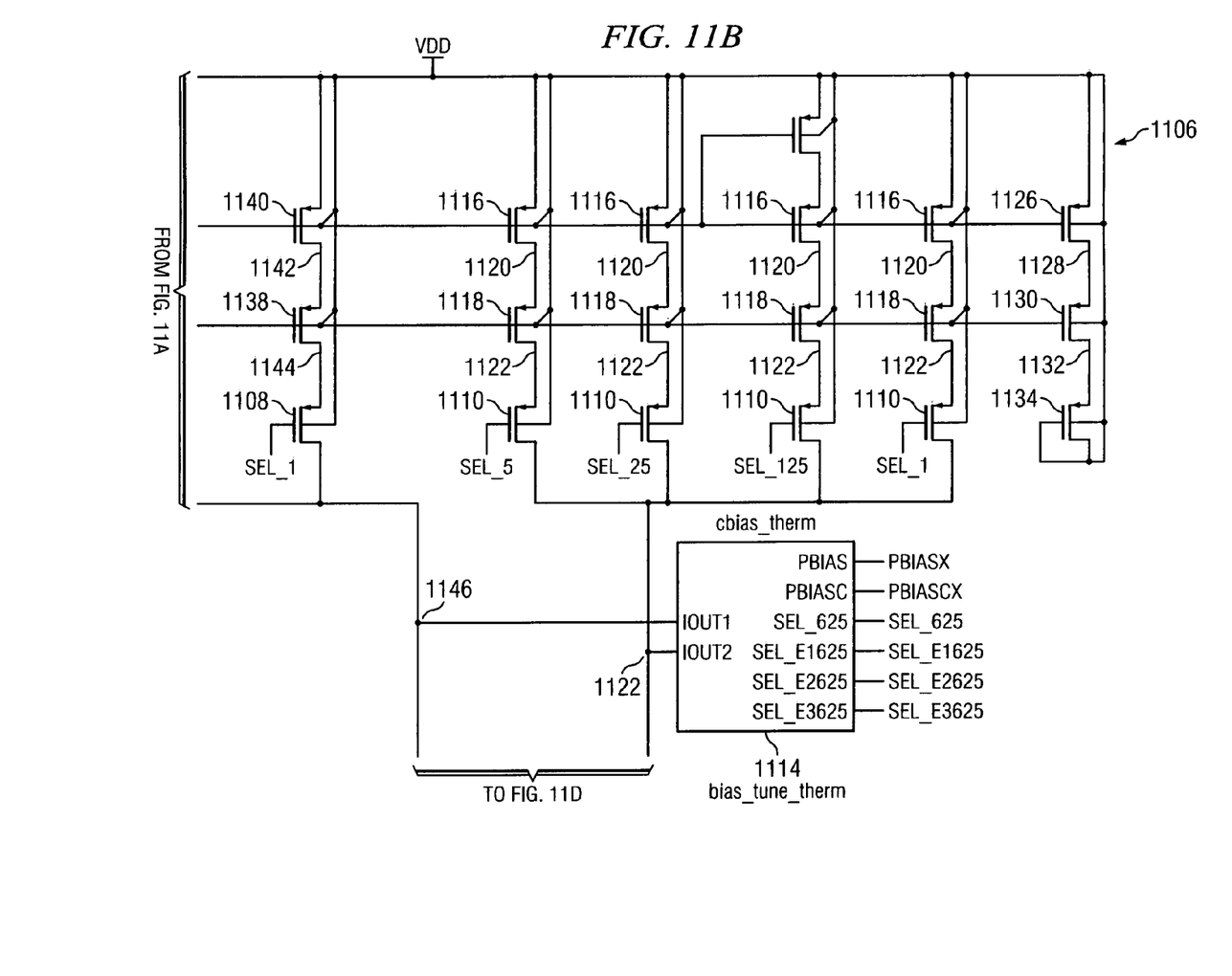
Figure 11C:
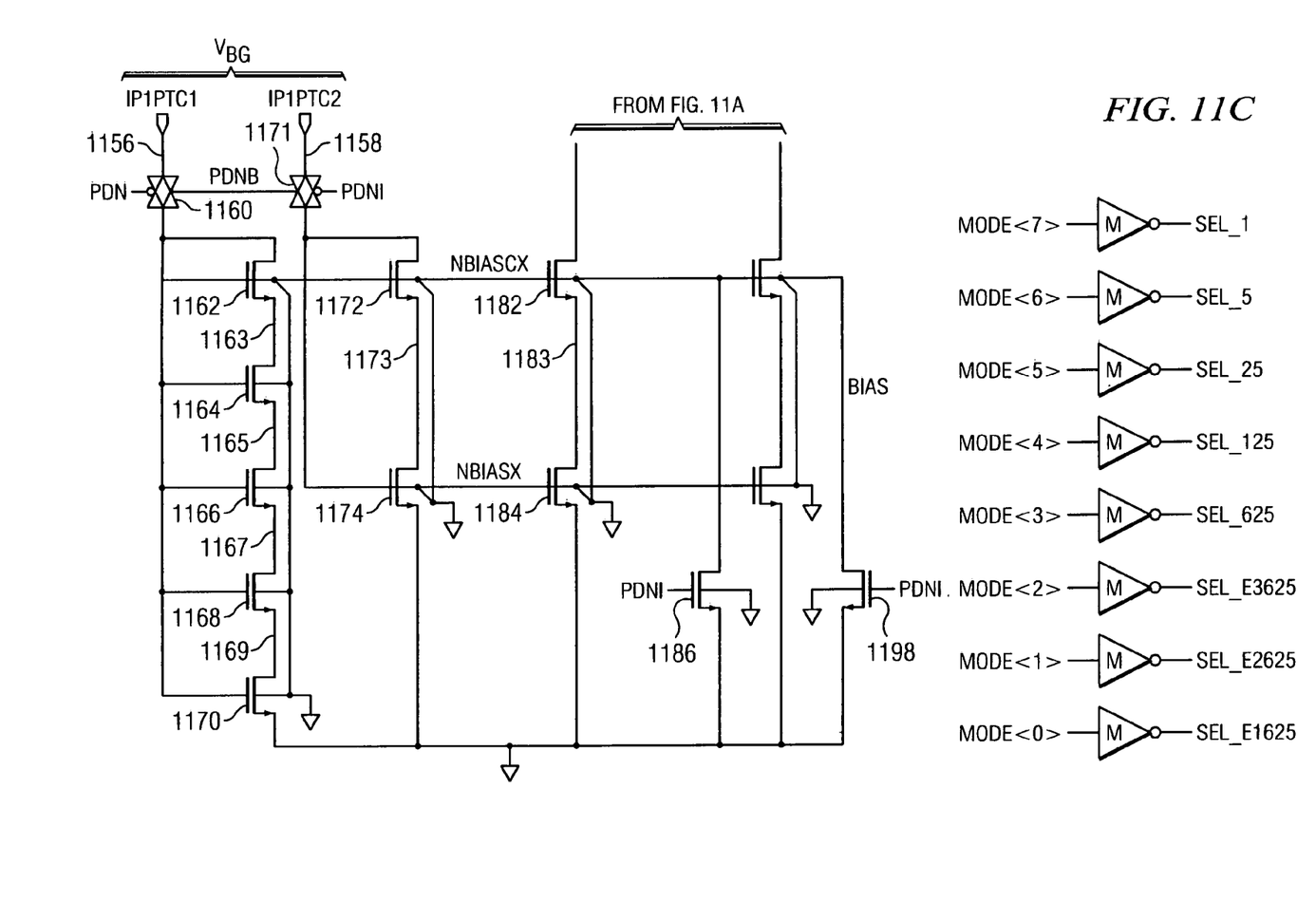
Figure 11D:
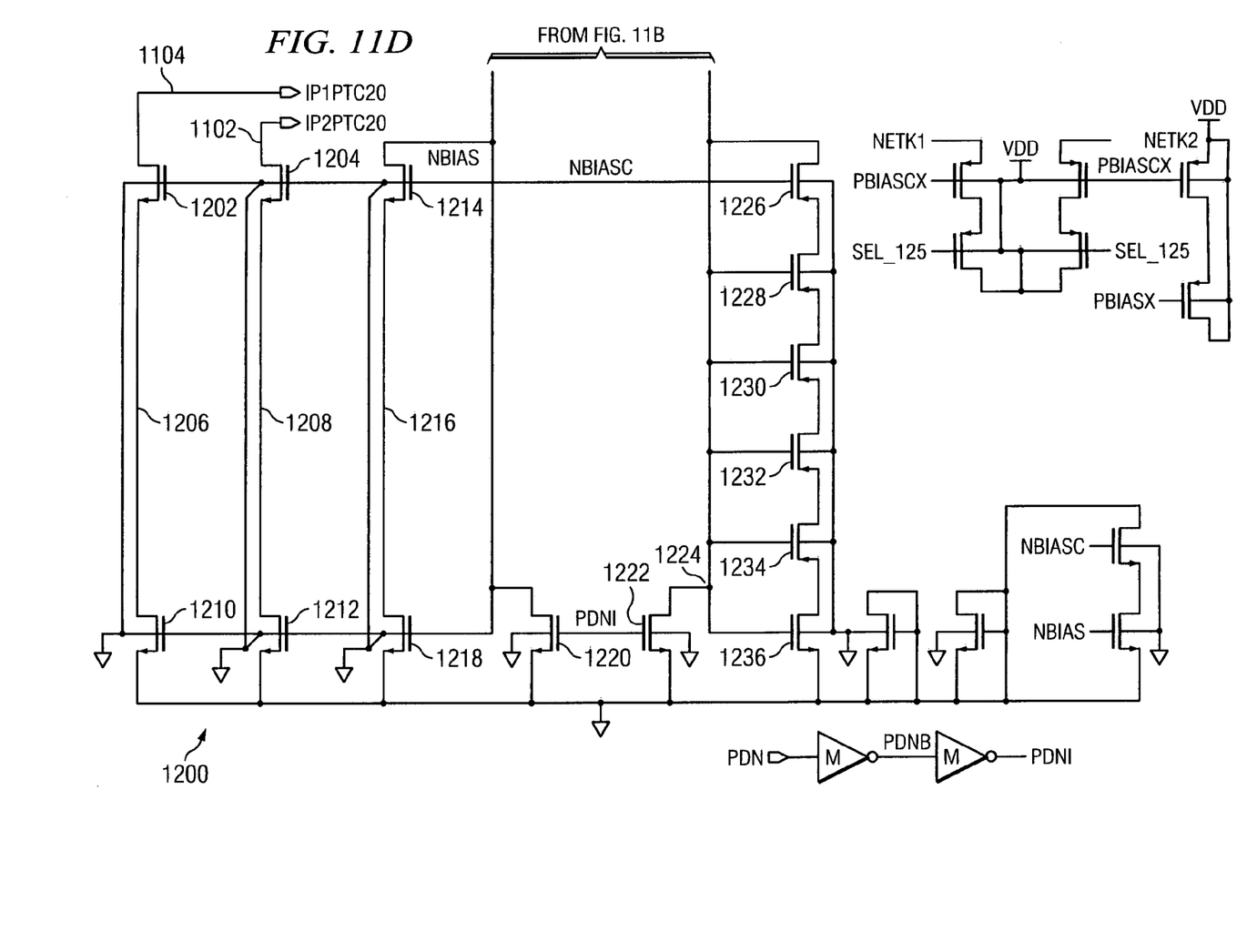

Referring now to FIG. 10, there is illustrated the comparator circuit within the smart squelch circuit (comparator) 624 of FIG. 6. The outputs from the GMC filter 508 are provided to the gates of transistor 1002 and transistor 1004. The drain source path of transistor 1002 is connected between node 1006 and a first input of a resistor string 1008. The resistance provided by the resistor string 1008 is controlled by the squelch input 1009. The comparator may operate with a hysteresis set by the squelch input 1009. During tuning mode a balanced resistance is provided on each side of the resistor string 1008. Transistor 1004 has its drain source path connected between node 1010 and a second input of resistor string 1008. The transistor 1012 has its source drain path connected between Vdd and node 1010. The gate of transistor 1012 is connected to the gates of transistors 1014 and 1016. Transistor 1016 has its source drain path connected between Vdd and node 1006. Transistor 1014 has its source drain path connected between Vdd and node 1018. The gate of transistor 1014 is also connected to the drain of transistor 1020. The source of transistor 1020 is connected to Vdd. Transistor 1012 also has its gate connected to its drain.

Transistor 1022 has its source drain path connected between Vdd and node 1006. The gate of transistor 1022 is connected to its drain and to the gates of transistors 1024 and 1026. Transistor 1024 has its source drain path connected between Vdd and node 1010. Transistor 1026 has its source drain path connected between Vdd and node 1028. Transistor 1030 has its source drain path connected between Vdd and node 1028 and has its gate connected to Vdd. Transistor 1032 has its drain connected to the gate of transistor 1026 and its source is connected to Vdd. The gate of transistor 1032 is connected to "pdnb." Transistor 1034 is connected between resistor string 1008 and node 1036. The gate of transistor 1034 is connected to bias input 1038. Transistor 1040 has its drain source path connected between node 1036 and ground. The gate of transistor 1040 is connected to bias input 1042. Transistor 1044 has its drain source path connected between node 1018 and ground. The gate of transistor 1044 is connected to "nbias_med." Transistor 1046 has its drain source path connected between node 1018 and ground. The gate of transistor 1046 is connected to "pdni." Transistor 1048 has its drain source path connected between node 1028 and ground. The gate of transistor 1048 is also connected to node 1028. Transistor 1050 has its drain source path connected between the gate of transistor 1048 and ground. The gate of transistor 1050 is connected to "pdni."

Referring now to FIG. 11, there is illustrated the schematic diagram for the IDAC 518 of FIG. 6. The IDAC 518 provides a pair of tuning inputs 1102 and 1104 connected to the GMC filter 508. A selection circuit 1106 enables the selection of a particular current value to be provided to the GMC filter 508 responsive to the tuning value provided from the flash memory 632. The selection inputs are provided to the gates of a plurality of transistors 1108 and 1110. Current sources of 0.125 micro amps through 1.02 micro amps are summed at node 1112. The block 1114 connected to node 1112 provides fine current values of 0.0625 micro amp at node 1112 and 1146. Four parallel branches each consisting of transistors 1116, 1118 and 1110 are connected between Vdd and node 1112. These branches provide currents of 1 micro amp, 0.125 micro amps, 0.25 micro amps and 0.5 micro amps for summing at node 112. Transistor 116 has its source drain path connected between Vdd and node 1120. Transistor 1118 in each branch has its source drain path connected between node 1120 and 1122. Transistor 1110 has its source drain path connected between node 1122 and node 1112 in each branch. The gates of transistors 1116 are each connected with each other. Likewise, the gates of transistors 1120 are interconnected with each other. As mentioned previously, the gates of transistor 1110 are connected to receive an input from the flash memory 632 to select the current branches necessary to provide a desired tuning current.

A dummy branch providing 0 micro amps consists of transistor 1126 having its source drain path connected between Vdd and node 1128 and having its gate connected to the gates of transistor 1116. Transistor 1130 has its source drain path connected between node 1128 and node 1132. The gate of transistor 1130 is connected to the gates of transistors 1118. Finally, transistor 1134 has its source drain path connected between node 1132 and Vdd. The gate of transistor 1134 is also connected to Vdd.

A second tuning current is provided from tuning circuit 1136 consisting of four branches providing 0.5 micro amps, 0.25 micro amps, 0.125 micro amps and 0.1 micro amps of current for summing at node 1146. Each branch is parallel with the other branches and consists of a series connection of transistors 1108, 1138 and 1140. Each branch of tuning circuit 1136 includes transistor 1140 having its source drain pathway connected between Vdd and node 1142. The gates of transistors 1140 are interconnected with each other and the gates of transistors 1116. Transistors 1138 has its source drain path connected between node 1142 and node 1144. The gates of transistors 1138 are interconnected with each other and the gates of transistors 1118. Transistor 1108 has its source drain path connected between node 1144 and node 1146. Node 1146 is the point at which the currents from each of the branches is summed up. Block 1114 provides fine tune currents in steps of 0.0625 micro amps at node 1146. As in tuning circuit 1106, the 0.125 micro amp branch of the tuning circuit 1136 includes a transistor 1150 having its source drain path connected between Vdd and the source of transistor 1140.

Bias circuit 1152 is connected to the gates of transistors 1140 and 1138. A bias current is provided from the band gap generator at 1156 and 1158. The bias current from 1156 is applied to a CMOS switch 1160. The output of the switch 1160 is applied to the gates of a number of transistors 1162, 1164, 1166, 1168 and 1170. Transistor 1162 has its drain source path connected between the output of switch 1160 and node 1163. Transistor 1164 has its drain source path connected between node 1163 and node 1165. Transistor 1166 has its drain source path connected between node 1165 and 1167. Transistor 1168 has its drain source path connected between node 1167 and 1169. Transistor 1170 has its drain source path connected between node 1169 and ground. Transistor 1172 has its drain source path connected between the output of amplifier 1171 and node 1173. Transistor 1174 has its drain source path connected between node 1173 and ground. The gate of transistor 1172 is connected to the gate of transistor 1162. The gate of transistor 1174 is connected to the output of amplifier 1171. Transistor 1176 is connected between Vdd and node 1177. The gate of transistor 1176 is connected to "pdnb." Transistor 1178 is connected between Vdd and node 1179. Transistor 1180 has its source drain path connected between node 1179 and node 1181. The gates of transistors 1178 and 1180 are connected to node 1177. The gate of transistor 1180 is also connected to the gate of transistor 1138. Transistor 1182 has its drain source pathway connected between node 1181 and node 1183. The gate of transistor 1182 is connected to the gate of transistor 1172. Transistor 1184 has its drain source path connected between node 1183 and ground. The gate of transistor 1184 is connected to the gate of transistor 1174. Transistor 1186 has its drain source path connected between the gate of transistor 1182 and ground.

Transistor 1188 is connected between Vdd and node 1189. The gate of transistor 1190 is connected to "pdnb." Transistor 1192 is connected between Vdd and node 1191. Transistor 1194 has its source drain pathway connected between node 1191 and node 1193. The gates of transistors 1192 and 1194 are connected to node 1189. The gate of transistor 1194 is also connected to the gate of transistor 1192. Transistor 1196 has its drain source pathway connected between node 1195 and node 1197. The gate of transistor 1196 is connected to the gate of transistor 1196. Transistor 1198 has its drain source path connected between node 1197 and ground. The gate of transistor 1198 is connected to the gate of transistor 1187. Transistor 1199 has its drain source path connected between the gate of transistor 1199 and ground.

An additional bias circuit 1200 is connected to summing nodes 1146 and 1112 to provide tuning outputs 1104 and 1102. Transistors 1202 and 1204 are connected to output nodes 1104 and 1102 respectively. The drain source path of transistor 1102 is connected between output line 1104 and node 1206. Transistor 1204 has its drain source path connected between line 1102 and node 1208. Transistor 1210 has its drain source path connected between node 1206 and ground. Transistor 1212 has its drain source path connected between node 1208 and ground. The transistor 1214 is connected between node 1146 and node 1216. Transistor 1218 is connected between node 1216 and ground. Transistor 1220 has its drain source path connected between node 1146 and ground. The gate of transistor 1220 is connected to the gate of transistor 1222. The drain source path of transistor 1222 is connected between node 1224 and ground. Connected between node 1212 and ground are a series connection of transistors 1226, 1228, 1230, 1232, 1234 and 1236. The gates of each of these transistors are connected to node 1224.

Figure 12:
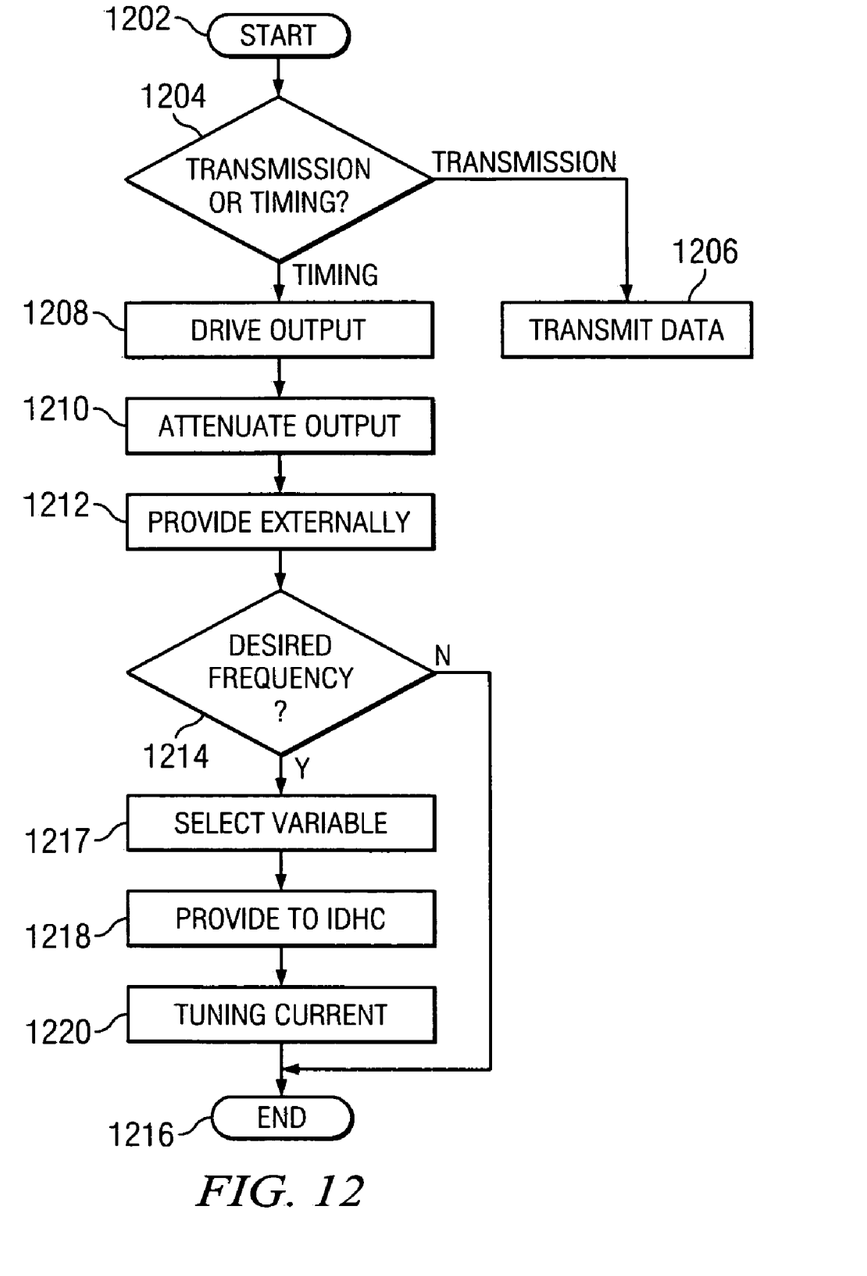
FIG. 12 is a flow diagram illustrating the operation of the GMC filter.

Referring now to FIG. 12, there is illustrated the operation of the GMC filter of the present invention. The process begins at Step 1202 and an inquiry is made at inquiry step 1204 to determine whether the GMC filter is operating in a data transmission mode or a tuning mode. If the filter is operating in the data transmission mode, the data is merely transmitted through the filter at Step 1206. If the filter is in the tuning mode, the comparator drives the output of the GMC filter between the power and ground rails at step 1208. At step 1210, the attenuator attenuates the output of the comparator to the linear input range of the GMC filter. The output of the comparator is also provided external to the chip at step 1212. Inquiry step 1214 determines if the frequency of the output comparator signal is at a desired frequency. If so, the process ends at step 1216. If not, a tuning variable is selected at 1217 from a flash memory to generate a tuning current to cause the GMC filter to provide an output at the desired frequency. The tuning variable is provided to the IDAC at step 1218. The IDAC produces a tuning current at 1220 using the tuning variable and a provided PTAT current.

Using the above identified method and apparatus, a GMC filter may be tuned using the oscillation frequency of the circuit.

Although the preferred embodiment has been described in detail, it should be understood that various changes, substitutions and alterations can be made therein without departing from the scope of the invention as defined by the appended claims.

What is claimed is:

1. A tunable GMC filter, comprising:
   a transconductance element;
   an attenuator connected in a negative feedback loop with the transconductance element, wherein the transconductance element and the attenuator form an oscillation circuit having an oscillation frequency;
   an input on the oscillation circuit for receiving a tuning current for tuning the oscillation frequency of the transconductance element to a predetermined frequency; and
   a comparator interfacing an output of the transconducance element and configured for driving the output of the transconductance element between a first level and a second level.

2. The tunable GMC filter of claim 1 further including a current generator for generating the current applied to the input, the generated current responsive to a frequency of the output of the comparator.

3. The tunable GMC filter of claim 2, wherein current generator generates the current from a current provided by a bandgap generator and a tuning value.

4. The tunable GMC filter of claim 3, wherein the tuning value is responsive to a frequency of the output of the comparator.

5. The tunable GMC filter of claim 4 further including a memory for storing a table associating the frequency of the output of the comparator with the tuning value.

6. tunable GMC filter of claim 5, wherein the memory stores a plurality of output frequencies associated with a plurality of tuning values.

7. The tunable GMC filter of claim 1, wherein the attenuator forces the output of the comparator to a linear input range of the transconductance element.

8. A tunable GMC filter, comprising:
   a transconductance element;
   an attenuator connected in a negative feedback loop with the transconductance element, wherein the transconductance element and the attenuator form an oscillation circuit having an oscillation frequency;
   an input for receiving a current for tuning the oscillation frequency of the transconductance element to a predetermined frequency;
   a comparator for driving an output of the transconductance element between a first level and a second level; and
   a current generator for generating the current applied to the input, the generated current responsive to a frequency of the output of the comparator.

9. The tunable GMC filter of claim 8, wherein current generator generates the current from a current providing by a bandgap generator and a tuning value.

10. The tunable GMC filter of claim 9, wherein the tuning value is responsive to a frequency of the output of the comparator.

11. The tunable GMC filter of claim 10 further including a memory for storing a table associating the frequency of the output of the comparator with the tuning value.

12. tunable GMC filter of claim 11, wherein the table associates a plurality of output frequencies with a plurality of tuning values.

13. The tunable GMC filter of claim 8, wherein the attenuator forces the output of the comparator to a linear input range of the transconductance element.

14. A method for tuning a GMC filter, comprising the steps of:
   operating the GMC filter at a first oscillation frequency;
   determining a difference between the first oscillation frequency and a predetermined second frequency by the steps of:
      operating the GMC filter to provide an output between a first level and a second level,
      determining the oscillation frequency of the provided output,
      selecting a tuning variable corresponding to a tuning current to provide the predetermining frequency rather than the oscillation frequency, and
      generating the tuning current responsive to the tuning variable; and
   providing a tuning current to the GMC filter responsive to the determined difference.

15. The method of claim 14 further including the step of operating the GMC filter in a tuning mode.

16. The method of claim 14, wherein the step of generating further includes the step of generating the tuning current from a current providing by a bandgap generator and the tuning variable.

17. The method of claim 16 further including the step of storing a table associating the oscillator frequency of the output with the tuning variable in an electronic memory.

18. The method of claim 17, wherein the table includes a plurality of oscillator frequencies associated with a plurality of tuning variables.

19. The method of claim 14 further including the step of attenuating an input signal applied to the GMC filter to a linear input range of the GMC filter.

* * * * *